(12) United States Patent
Okada et al.

(10) Patent No.: US 11,673,809 B2
(45) Date of Patent: Jun. 13, 2023

(54) APPARATUS FOR MANUFACTURING POLYSILICON ROD

(71) Applicant: Shin-Etsu Chemical Co., Ltd., Tokyo (JP)

(72) Inventors: Tetsuro Okada, Niigata (JP); Naruhiro Hoshino, Niigata (JP); Masahiko Ishida, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 89 days.

(21) Appl. No.: 17/345,571

(22) Filed: Jun. 11, 2021

(65) Prior Publication Data

US 2022/0002164 A1 Jan. 6, 2022

(30) Foreign Application Priority Data

Jul. 2, 2020 (JP) .............................. JP2020-114568

(51) Int. Cl.
*C23C 16/24* (2006.01)
*C01B 33/035* (2006.01)
*C23C 16/458* (2006.01)
*C23C 16/46* (2006.01)

(52) U.S. Cl.
CPC ............ *C01B 33/035* (2013.01); *C23C 16/24* (2013.01); *C23C 16/458* (2013.01); *C23C 16/46* (2013.01)

(58) Field of Classification Search
CPC ..................................................... C23C 16/24
See application file for complete search history.

(56) References Cited

U.S. PATENT DOCUMENTS

| 5,593,465 | A | 1/1997 | Seifert et al. |
| 2010/0229796 | A1 | 9/2010 | Endoh et al. |
| 2012/0222619 | A1* | 9/2012 | Netsu ................. C23C 16/458 |
| | | | 118/723 R |
| 2016/0122875 | A1* | 5/2016 | Kelly .................... C23C 16/46 |
| | | | 118/500 |

FOREIGN PATENT DOCUMENTS

| JP | H08-045847 A1 | 2/1996 |
| JP | 2805457 A | 9/1998 |
| JP | 2006240934 A | 9/2006 |
| JP | 2010-235440 A1 | 10/2010 |
| JP | 2013-249251 A1 | 12/2013 |
| JP | 2014-101256 A1 | 6/2014 |

OTHER PUBLICATIONS

Office action from corresponding Japanese Patent Application No. 2020-114568 dated Apr. 25, 2023, and its English translation from Global Dossier.

* cited by examiner

*Primary Examiner* — Keath T Chen
(74) *Attorney, Agent, or Firm* — Ladas & Parry, LLP

(57) ABSTRACT

An apparatus for manufacturing polysilicon rod by a Siemens method has a base plate 20; and a holding body 100 provided on the base plate 20 so as to be movable in a horizontal direction and electrically connect between a core wire holder 1 and an electrode 4. The holding body 100 is configured to rotatably hold the core wire holder 1 with respect to the base plate 20.

4 Claims, 4 Drawing Sheets

APPARATUS FOR MANUFACTURING POLYSILICON ROD

TECHNICAL FIELD

The present invention is related to an apparatus for manufacturing a polysilicon rod by a Siemens method.

The present application claims the priority of Japanese Patent Application No. 2020-114568 filed on Jul. 2, 2021, the contents of which are entirely incorporated by reference.

BACKGROUND ART

Polysilicon is a raw material of monocrystalline silicon for manufacturing a semiconductor and silicon for manufacturing a solar cell. As a method for manufacturing polysilicon, a Siemens method is known, and in this method, generally, a silane-based material gas is brought into contact with a heated silicon core wire to deposit the polysilicon on a surface of the silicon core wire by a chemical vapor deposition (CVD) method.

In the Siemens method, two silicon core wires are assembled in a vertical direction and one silicon core wire is assembled in a gate shape (inverted U-shape) in a horizontal direction, and opposite ends of the silicon core wires are connected to core wire holders respectively to be fixed to a pair of metal electrodes arranged on a base plate. In general, a plurality of sets of inverted U-shaped silicon core wires are disposed in a reactor.

When the inverted U-shaped silicon core wire is electrically heated to a deposition temperature and a mixed gas of, for example, trichlorosilane and hydrogen as a raw material gas is brought into contact with the silicon core wire, polysilicon is vapor-grown on the silicon core wire, and a polysilicon rod having a desired diameter is formed in the inverted U-shape.

The electrode penetrates the base plate via an insulator and is connected to another electrode or is connected to a power supply disposed outside the reactor. In a process of depositing the polysilicon, the electrode, the base plate, and a bell jar are cooled by a refrigerant such as water in order to prevent the polysilicon from being deposited on the electrode and prevent metallic contamination of the polysilicon, which is caused by an increase of a temperature of the electrode, during the depositing.

FIG. 4 is a conceptual diagram for exemplarily illustrating an aspect in which an electrode holder is attached to the electrode to hold a core wire holder 11 in the related art. In an example illustrated in FIG. 4, an electrode 14 made of metal and the core wire holder 11 made of carbon are connected via an electrode adapter 13 in order to suppress wear of the electrode 14, and the electrode adapter 13 is fixed to the electrode 14 by screwing.

A current is supplied from the electrode 14 to the silicon core wire (not illustrated) held at a top of the core wire holder 11 via the core wire holder 11, and a surface of the silicon core wire is heated to a temperature range of about 900° C. to 1200° C. by Joule heat in a hydrogen atmosphere. In this state, for example, high-purity silicon is vapor-grown on the silicon core wire so that a polysilicon rod is grown by supplying a mixed gas of, for example, trichlorosilane and hydrogen as a raw material gas into a reactor.

During this process, the deposition of the polysilicon proceeds on the core wire holder 1 made of carbon with an increase in a diameter of the polysilicon rod, and the polysilicon is gradually integrated with the core wire holder 11. Since electric resistance decreases with growth of the polysilicon rod, the current to be supplied is gradually increased in order to maintain a surface temperature of the polysilicon rod at a temperature suitable for the deposition reaction.

In general, the current supplied to the polysilicon rod is a large current of 2000 amperes to 4000 amperes at the end of the deposition reaction. As the diameter of the polysilicon rod increases, a heat radiation amount from a rod surface increases. Therefore, it is necessary to increase an electric energy supplied to the polysilicon rod so as to compensate the heat amount lost when the heat is radiated from the rod surface in order to maintain a temperature necessary for the deposition reaction (900° C. to 1200° C.)

Since the polysilicon has a property in which electric resistivity decreases as the temperature increases, basically, the most current flows at the center of the rod at which the temperature is high. Therefore, in a bridge part of the rod, the inner side of the inverted U-shape has a high temperature and a maximum current.

Since the rod has the inverted U-shape, a fact that a distance along an inner side of the rod at a corner is short as an electric circuit, and a fact that radiation from each of a straight body and a bridge of the corner is easily received by each other, and the straight body and the bridge of the corner are easily heated are considered as a cause.

SUMMARY OF INVENTION

Problem to be Solved by Invention

Therefore, there is a problem that as the rod diameter increases, a temperature difference between the inner side and the outer side of the bridge part increases, and a crack is likely to be generated since differences in elongation of the bridge part during growth and contraction at the time of cooling after the end of growth become more remarkable.

The crack during the growth generates a force to open the inverted U-shape due to the temperature difference between a low temperature on the outer side and a high temperature on the inner side of the corner of the inverted U-shaped part of the rod. At this time, when the electrodes at the foot are fixed to the opposite ends of the rod, the rod cannot be deformed, stress exceeds a predetermined value, and thus the crack is generated. Since this growing crack causes fluctuation of the applied current, and the rod temperature fluctuates, an adverse influence is given to homogeneity of a crystal. When the influence of the crack increases, the current cannot be applied, and the reaction has to be interrupted in the middle.

On the other hand, at the time of cooling after the end of the growth, since the inner side of the corner at a higher temperature contracts the most, a force that closes the inverted U shape is generated. Then, when the rod cannot be deformed and the stress exceeds a predetermined value, the crack is generated. It is empirically known that the crack at the time of cooling is larger in scale than the crack during the growth, and the crack may be propagated throughout the rod, which leads to collapse of the rod.

As described above, in the Siemens method, the crack of the rod is generated by the temperature difference between the inner side and the outer side of the inverted U-shape. Therefore, it can be seen that a two-dimensional force including a rotation force with a contact point between the rod straight body part and the bridge part as a fulcrum is applied in addition to simple elongation and contraction caused by the temperature change of the entire rod.

An economic damage for manufacturing the rod, which is caused by the crack generation, is a major concern. However, in order to cope with the two-dimensional force described above, elongation and contraction, and a rotating mechanism are required. In addition, a usable material is required to have high temperature resistance, and high strength, and be a low contamination source in the nature of the Siemens method. Furthermore, in order to keep manufacturing stably in efficiency and quality, cleaning and installation between batches are required to be capable of easily performed. Therefore, it is significantly difficult to solve the problem.

As for the electrode adapter, a new structure has been proposed so far.

For example, JP 2006-240934 A discloses a device in which an electrode and a holder are electrically connected to be slidable, but the device cannot cope with a rotational movement with a contact point between a rod straight body part and a bridge part as a fulcrum.

In JP 2805457 B2, horizontal and inclining movements of the electrode holder can be performed by using a spring element, but cleaning between batches is significantly difficult and it is nearly impossible to keep all surfaces clean since a shape is complicated due to the use of the spring elements. In holding by the spring, there is a problem that a force required for the movement becomes larger as the movement amount increases, and a sufficient movement amount cannot be secured when the diameter increases more and the required movement amount increases.

As described above, the electrode adapter in the related art does not have a sufficient degree of freedom of the movement and/or countermeasures for cleaning performed between batches are not sufficient for the electrode adapter. Therefore, an object of the present patent is to provide an apparatus for manufacturing polysilicon, the apparatus in which an electrode adapter can be moved in a horizontal direction and rotated, and the polysilicon is easy to clean.

Means for Solving Problem

[Concept 1]

An apparatus for manufacturing polysilicon rod by a Siemens method may comprise:
a base plate; and
a holding body provided on the base plate so as to be movable in a horizontal direction and electrically connect between a core wire holder and an electrode,
wherein the holding body is configured to rotatably hold the core wire holder with respect to the base plate.

[Concept 2]

In the apparatus for manufacturing polysilicon rod according to concept 1,
the holding body may include a pedestal provided on the base plate so as to be movable in the horizontal direction, and the electrode adapter provided so as to be rotatable with respect to the base plate and electrically connect between the core wire holder and the electrode.

[Concept 3]

In the apparatus for manufacturing polysilicon rod according to concept 2,
the pedestal may have a curved surface part on an upper part thereof, and
the electrode adapter may be rotatable along the curved surface part and slidable in the horizontal direction with respect to the electrode.

[Concept 4]

The apparatus for manufacturing polysilicon rod according to concept 3, may further comprise a pressing part, wherein
the electrode adapter includes an electrode adapter body part rotatably provided on the curved surface part, and an electrode adapter slide part extending in the horizontal direction from the electrode adapter body part and contacting the electrode, and the electrode may be clamped between the electrode adapter slide part and the pressing part.

[Concept 5]

In the apparatus for manufacturing polysilicon rod according to any one of concepts 2 to 4,
each of the base plate, the electrode adapter and the electrode may be formed only by a flat surface and a spherical surface or a curved surface having a radius of 5 mm or more.

[Concept 6]

In the apparatus for manufacturing polysilicon rod according to concept 5,
each of the base plate, the electrode adapter and the electrode may not have an internal corner part having an angle of less than 90 degrees.

[Concept 7]

In the apparatus for manufacturing polysilicon rod according to any one of concepts 2 to 4,
the pedestal provided on the base plate may be an insulator.

According to the aspect of the present invention, the electrode adapter can be moved in the horizontal direction and rotated, the polysilicon that is easy to clean can be manufactured, and the crack at the time of cooling during the growth and after the growth can be reduced.

DETAILED DESCRIPTION

Figure 1:
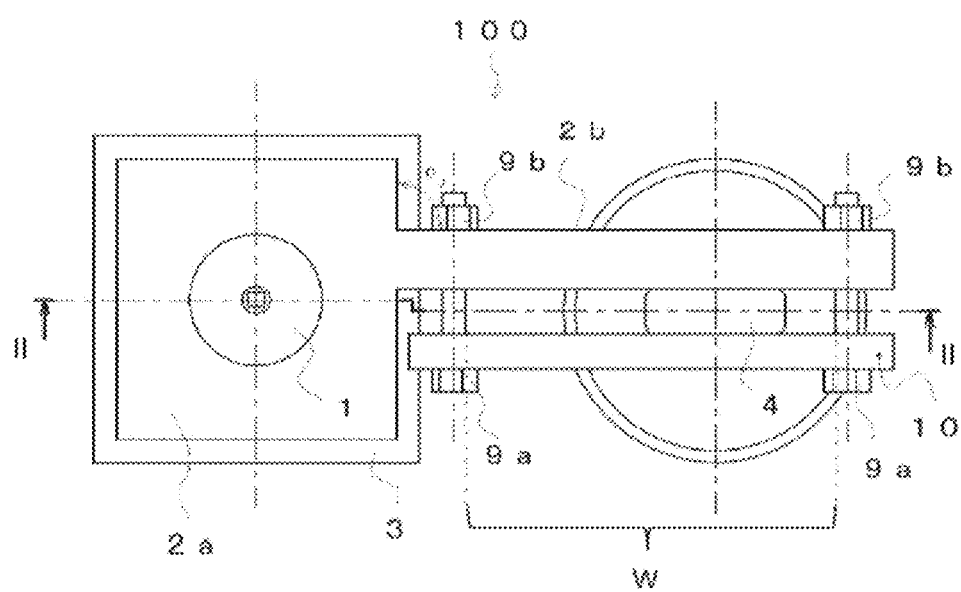
FIG. 1 is a plan view illustrating a concept of an aspect in which an electrode holder according to an embodiment of the present invention is attached to a metal electrode to hold a core wire holder.
Figure 2:
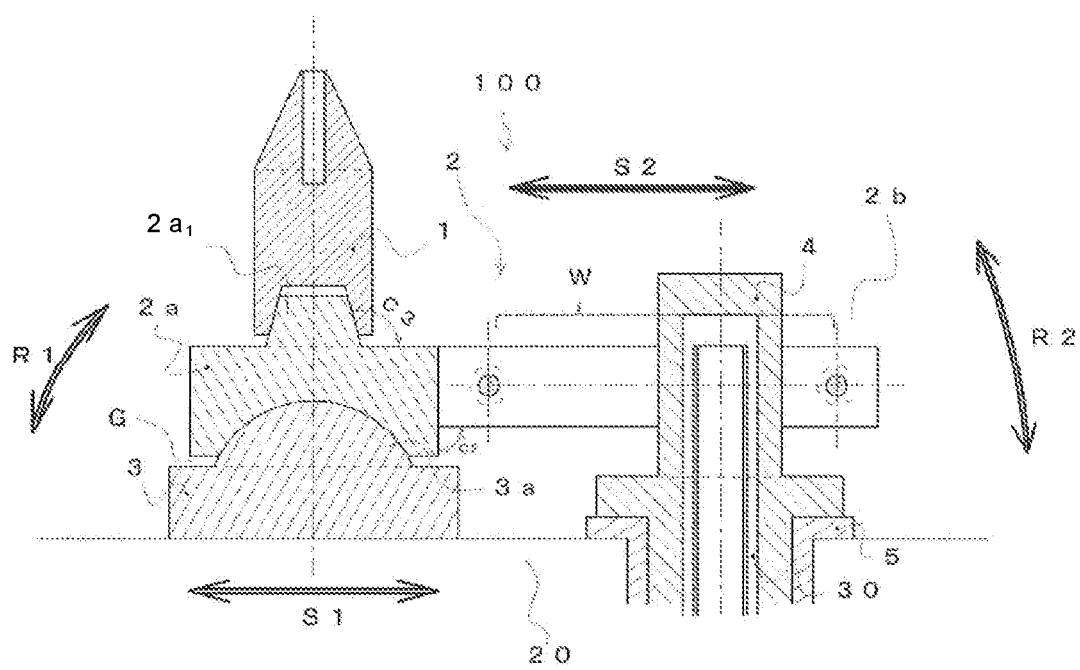
FIG. 2 is a side cross sectional view taken along line II-II of FIG. 1.

The embodiment provides an apparatus for manufacturing polysilicon rod by a Siemens method. As illustrated in FIGS. 1 and 2, the apparatus for manufacturing polysilicon rod according to the embodiment includes a holding body 100 that is provided on a reactor base plate (base plate) 20 so as to be movable in a horizontal direction, and electrically connects between a core wire holder 1 and a metal electrode (electrode) 4. The holding body 100 is configured to rotatably (swingably) hold the core wire holder 1 with respect to the reactor base plate 20. The holding body 100 may hold the core wire holder 1 so as to be rotatable in a vertical direction with respect to the reactor base plate 20, and may hold the core wire holder 1 so as to be rotatable in a horizontal plane. In FIG. 2, arrows R1 and R2 for indicating that the holding body 100 holds the core wire holder 1 rotatably (swingably) in the vertical direction with respect to the reactor base plate 20 are illustrated. In FIG. 2, arrows S1 and S2 for indicating that the holding body 100 is movable in the horizontal direction with respect to the reactor base plate 20 are also illustrated.

The holding body 100 may include an adapter base (pedestal) 3 that is provided on the reactor base plate 20 so as to be movable in the horizontal direction, and an electrode adapter 2 that is provided so as to be rotatable (swingable) with respect to the adapter base 3 and electrically connects between the core wire holder 1 and the metal electrode 4.

The adapter base 3 may have a curved surface part 3a on an upper part thereof. The electrode adapter 2 may be rotatable along the curved surface part 3a and slidable in the horizontal direction with respect to the metal electrode 4.

The electrode adapter 2 may include an electrode adapter body part 2a rotatably provided on the curved surface part 3a of the pedestal 3, and an electrode adapter slide part 2b extending in the horizontal direction from the electrode adapter body part 2a and contacting the metal electrode 4. The electrode adapter body part 2a and the electrode adapter slide part 2b may be integrally formed.

As illustrated in FIG. 2, the electrode adapter body part 2a may have a quadrangular shape in a plan view, and the electrode adapter slide part 2b may also have a quadrangular shape in a plan view. The adapter base 3 may also have a quadrangular shape in a plan view. The curved surface part 3a of the adapter base 3 may have a circular shape in a plan view.

In the aspect illustrated in FIGS. 1 and 2, the metal electrode 4 is fixed on the reactor base plate 20 via an insulator 5, and is formed as a substantially rectangular parallelepiped protrusion. The electrode adapter slide part 2b is in contact with a pressing part such as a pressing plate 10 by clamping the metal electrode 4 between the electrode adapter slide part 2b and the pressing part, and the electrode adapter slide part 2b and the pressing part are fastened by a bolt 9a and a nut 9b. The metal electrode 4 can be clamped between the electrode adapter slide part 2b and the holding plate 10 within a predetermined interval W of the electrode adapter slide part 2b. By loosening the fastening of the bolt 9a and the nut 9b, a position of the electrode adapter 2 with respect to the metal electrode 4 can be slid in the horizontal direction. The electrode adapter body part 2a has a protruding part 2a₁ to which the core wire holder 1 can be connected on an upper part thereof. A lower part of the electrode adapter body part 2a is connected to the adapter base 3 via the curved surface part 3a. By adopting this aspect, the core wire holder 1 can be slid and rotated.

A refrigerant 30 is provided in the metal electrode 4 (refer to FIG. 2), and the metal electrode 4 may be configured to be cooled from the inside.

In the aspect illustrated in FIG. 2, a gap G is provided in the vertical direction between the electrode adapter body part 2a and the adapter base 3, and the electrode adapter body part 2a is rotatable (swingable) in the vertical direction in FIG. 2 (refer to arrow R1 in FIG. 2) and is movable in the horizontal direction in FIG. 2 (refer to arrow S1 in FIG. 2). When the electrode adapter body part 2a is rotated in the vertical direction, the electrode adapter slide part 2b is also rotated in the vertical direction (refer to arrow R2 in FIG. 2). When the electrode adapter body part 2a is moved in the horizontal direction, the electrode adapter slide part 2b is also moved in the horizontal direction (refer to arrow S2 in FIG. 2).

As an example, the metal electrode 4 may be attached so as to be rotatable (swingable) in the horizontal direction. In this case, the electrode adapter body part 2a is also rotatable in the horizontal direction with respect to the adapter base 3.

The electrode adapter 2, the adapter base 3, the metal electrode 4, and the holding plate 10 that are continuously used between the batches may all be formed as a flat surface and a simple spherical surface or a curved surface, the simple spherical surface or the curved surface being gently curved to have a radius of 5 mm or more, and furthermore may have a shape that does not have an internal corner part having an angle of less than 90 degrees. In this case, for example, cleaning can be easily performed manually by using a general cloth-like cleaning tool such as BEMCOT. Since the bolt 9a and the nut 9b are small components, even when the bolt 9a and the nut 9b are replaced with new components in each batch, an economic burden is small. In addition, even when two sets of the bolt 9a and the nut 9b are prepared and one set is cleaned while the other set is in use, a temporal burden is small. It is advantageous to adopt an aspect that does not have an internal corner part having an angle of less than 90 degrees in that the shape does not have a part that is difficult to clean. There is a possibility that a film deposited at a corner part having an acute angle peels off at the time of deposition (since stress of the deposited film increases to thicken the film, and/or to deposit the film without maintaining sufficient adhesion to the internal corner part), flies up in a chamber, and become a contamination source. However, by adopting an aspect that does not have the internal corner part having an angle of less than 90 degrees, an occurrence of the event described above can be prevented. It is more preferable that the ease of cleaning can be improved and the possibility of being a contamination source can be reduced by adopting the aspect that does not have an internal corner part having an angle of less than 120 degrees. It is also possible to adopt an aspect that does not have an internal corner part having an angle of less than 60 degrees. In this case, although an effect is low compared with that of the aspect that does not have an internal corner part having an angle of less than 90 degrees, a certain level of an effect can be obtained in that the ease of cleaning can be improved and the possibility of being the contamination source can be reduced. "c1" in FIG. 1 and "c2" in FIG. 2 have an angle of 90 degrees, and "c3" has an angle exceeding 90 degrees.

It is desirable that the adapter base 3 is an insulator for preventing the current from be applied to the reactor base plate 20. However, the present invention is not limited to this, and a conductive member may be used as the adapter base 3. In this case, the intended function is achieved by using a material having high slidability and placing a flat plate formed of an insulator between the adapter base 3 and the reactor base plate 20.

Figure 3:
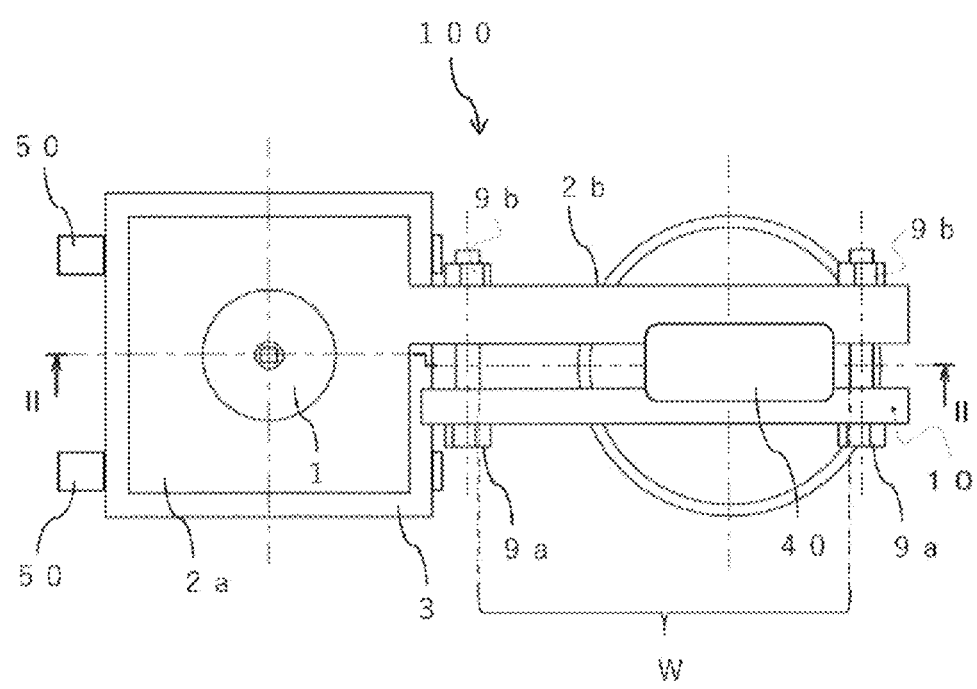
FIG. 3 is a view corresponding to FIG. 1, and is a plan view illustrating a modification example of an embodiment of the present invention.

A cover 40 functioning as a stopper may be provided at the top of the metal electrode 4 so that the electrode adapter slide part 2b is not unintentionally detached from the metal electrode 4 (refer to FIG. 3).

As illustrated in FIG. 3, the adapter base 3 may be provided on a guide part 50 extending in the horizontal direction, and movable in the horizontal direction along the guide part 50. In the aspect illustrated in FIG. 3, the guide part 50 extends in the same direction as the electrode adapter slide part 2b in a plan view.

A cover for protecting the metal electrode 4 and a movable part of the electrode adapter slide part 2b may be provided, and a carbon sheet for assisting to apply the current and slide at a contact part may be provided therebetween.

Example

Figure 4:
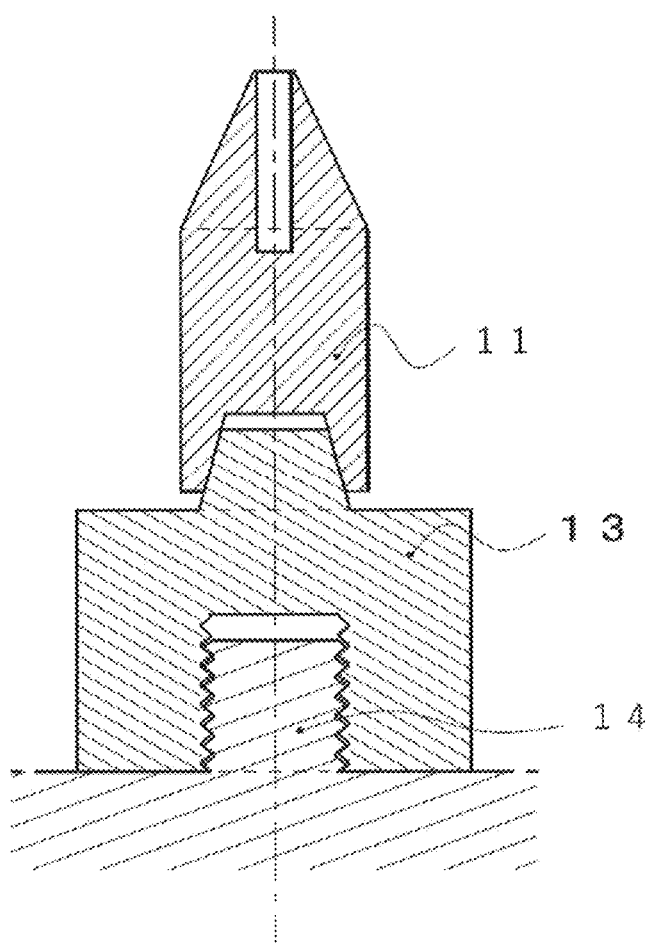
FIG. 4 is a side cross sectional view illustrating a concept of an aspect in which an electrode holder in the related art is attached to a metal electrode to hold a core wire holder.

By the Siemens method, a reaction to grow the polysilicon rod until the diameter of the polysilicon rod is about φ 160 mm was performed five batches each, and a crack generation rate was confirmed. In the most common fixed metal electrode and electrode adapter in the related art, which correspond to FIG. 4, a current fluctuation due to the crack generation was confirmed in two batches at the time of growth, a crack at the time of cooling were confirmed in all five batches, and collapse of the rod was confirmed in one batch of the five batches. On the other hand, in the configuration according to the embodiment illustrated in FIGS. 1 and 2, there was not the current fluctuation considered to be caused by the crack generation during growth, and a crack at the time of cooling were confirmed in three batches, but there was no collapse of the rod.

REFERENCE SIGNS LIST 1 core wire holder
2 electrode adapter
2a electrode adapter body part
2b electrode adapter slide part
3 adapter base (pedestal)
4 metal electrode (electrode)
5 insulator
9a bolt
9b nut
10 holding plate
20 reactor base plate (base plate)
20 refrigerant
100 holding body
S1, S2 slide direction
R1, R2 rotation direction (swinging direction)

The invention claimed is:

1. An apparatus for manufacturing polysilicon rod by a Siemens method comprising:
    a base plate; and
    a holding body provided on the base plate electrically connecting a core wire holder and an electrode,
    wherein the holding body is configured to rotatably and slidably hold the core wire holder with respect to the base plate;
    wherein the holding body includes:
    a pedestal provided on the base plate, the pedestal has a curved surface part on an upper part thereof, and
    an electrode adapter body between the core wire holder and the pedestal,
    the electrode adapter body is connected to the adapter base via the curved surface part of the pedestal so as to be rotatable with respect to the base plate and electrically connect between the core wire holder and the electrode,
    an electrode adapter slider extending in the horizontal direction from the electrode adapter body and contacting the electrode,
    a pressing plate, the electrode is clamped between the electrode adapter slider and the pressing plate so as the electrode adapter body is movable in the horizontal direction.

2. The apparatus for manufacturing polysilicon rod according to claim 1, wherein
    each of the base plate, the electrode adapter and the electrode is formed only by a flat surface and a spherical surface or a curved surface having a radius of 5 mm or more.

3. The apparatus for manufacturing polysilicon rod according to claim 2, wherein
    each of the base plate, the electrode adapter and the electrode does not have an internal corner part having an angle of less than 90 degrees.

4. The apparatus for manufacturing polysilicon rod according to claim 1, wherein
    the pedestal provided on the base plate is an insulator.

* * * * *